United States Patent [19]

Weinert

[11] Patent Number: 4,768,738

[45] Date of Patent: Sep. 6, 1988

[54] FLEXIBLE SOLAR SKIN IN COMBINATION WITH AN AIRPLANE

[76] Inventor: Friedrich Weinert, 219-19 1 31st Ave., Jamaica, N.Y. 11413

[21] Appl. No.: 916,960

[22] Filed: Oct. 8, 1986

[51] Int. Cl.[4] .................. B64C 27/24; B64C 25/10; H01L 25/00

[52] U.S. Cl. .................. 244/53 R; 136/244; 136/256; 136/291; 244/62; 244/102 R; 244/102 SS; 244/24; 244/31

[58] Field of Search ............. 136/244, 245, 256, 291, 136/292; 244/1 R, 173, 4 R, 24, 31, 53 R, 62, 102 R, 102 SS

[56] References Cited

U.S. PATENT DOCUMENTS

| 4,537,838 | 8/1985 | Jetter et al. ........................ 429/9 |
| 4,574,161 | 3/1986 | Marks ............................... 136/263 |

FOREIGN PATENT DOCUMENTS

| 2616000 | 10/1977 | Fed. Rep. of Germany .... 244/53 R |
| 59-143378 | 8/1984 | Japan ................................ 136/245 |
| 59-144177 | 8/1984 | Japan ................................ 136/245 |

OTHER PUBLICATIONS

"Flight International", Jun. 30, 1979, p. 2336.

Primary Examiner—Aaron Weisstuch

[57] ABSTRACT

A flexible solar skin which absorbs radiant solar energy to convert it into electricity, made possible through a conductive plastic, which conceals a conductive fiber, whereby the fiber directs generated electricity to a terminal in the form of a contact strip hemmed or fused alongside the material. Additionally, an air vehicle covered with this photovoltaic material to collect solar radiant energy during flight which is converted into electricity to assist the propulsion system of the vehicle.

4 Claims, 1 Drawing Sheet

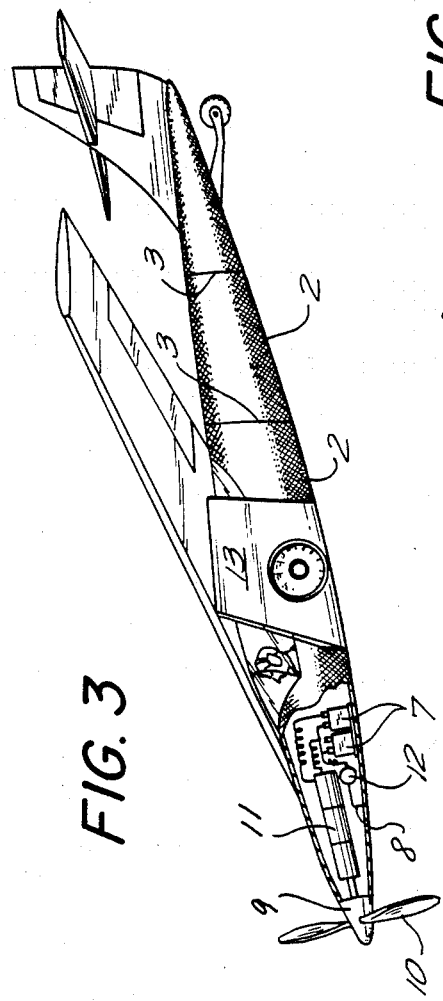
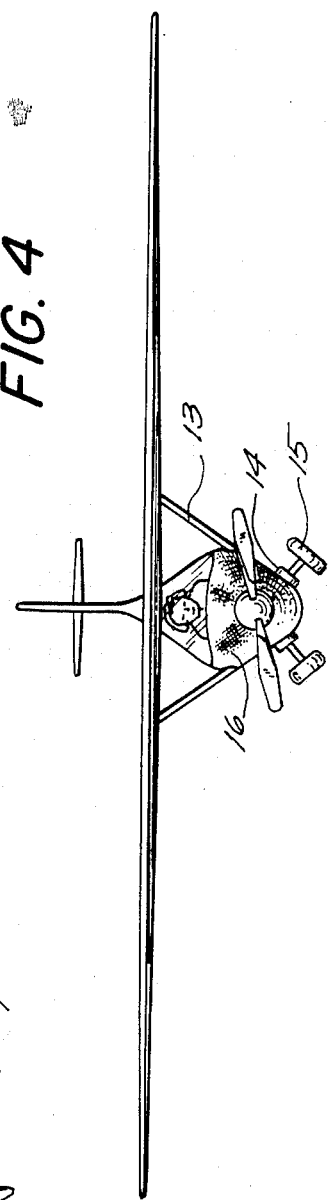
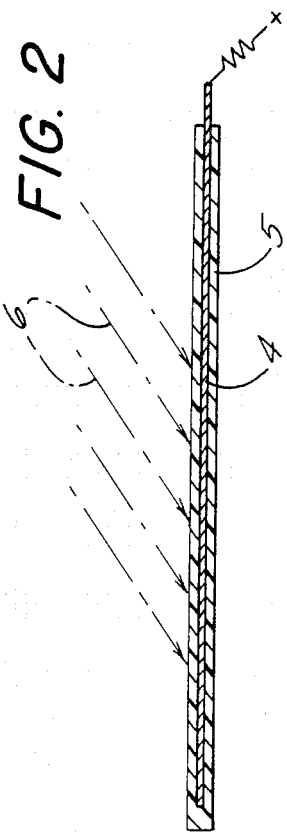
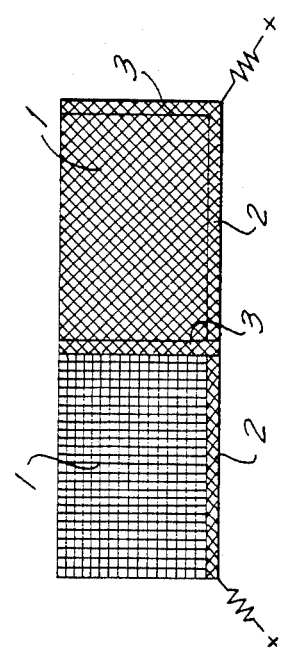
FIG. 1
FIG. 2
FIG. 3
FIG. 4

FLEXIBLE SOLAR SKIN IN COMBINATION WITH AN AIRPLANE

BACKGROUND OF THE INVENTION

There are numerous solar cells available on the market generally made of a solid layer of silicon concealing a conductive coil. Those panels or plates must be put in a fixed position like a window. The present invention introduces a plastic flexible material from the conducting polymer family which is used as a coating for carbon or magnesium fiber. This will produce a solar radiant absorbing thread. The thread can be fed through a conventional knitting machine. The garment produced is a light weight skin which can be used for sails or outlining for zepplins, gliders and aeroplanes. The benefit obtained is solar energy collected during flight where the skin converts solar energy into electricity used to assist the propulsion system of the vehicle. There is a wide range of use for such a material particularly in the aerodynamic industry. Therefore, the inventor designed an aeroplane most suitable for this material. It is a light weight plane like a glider, equipped with a light weight engine which is activated through electrical impulses. This combination would allow the plane to cover great distances without refueling.

OBJECTS OF THE INVENTION

The principle of the invention is to provide a new flexible photovoltaic material in the form of a light weight material which can be applied to flying vehicles not only to dress those vehicles, but also to supply those vehicles with additional energy when exposed to the sun. The inventor has already designed a light weight engine, for this purpose, called Spindle Drive with expansible chamber motor, U.S. Pat. No. 4,553,394, Nov. 19, 1985.

However, other prime movers can be used as well. If an aeroplane, zeppelin, balloon, or sail boat is dressed in this material, then the surplus energy gained through solar exposure can be used to assist the utility or propulsion system. The uniqueness of the material is the thread which is made of a conductive fiber, like carbon magnesium or aluminum, concealed in a layer of lumeloid or other conductive plastic in the polymer family. This material is flexible and water resistant and can be manufactured in a variety of thickness and density depending on the thickness of the thread and the weave pattern. To make it water and airproof a fine coating or layer of lumeloid or rubber can be applied to the surface of the material. The material can also be glued against a reflective material as commonly used on aeroplanes. Not only to gain solar energy for the propulsion system but also for utilities, as for instance deiceing the wings. Because of this invention, gliders, zeppelins and balloons become more attractive in sports and industry because of their ability to convert radiant solar energy into electricity.

BRIEF DESCRIPTION OF THE DRAWINGS

FIG. 1 is an explanatory view showing two sheets of the present invention in a commonly used weave pattern, where the bottom and side edge has a conductive strip, joined to the conductive fiber of the garment.

FIG. 2 shows a plan view of a single thread indicating fiber, coating and contact strip.

FIG. 3 is a perspective side view of an aeroplane dressed in a photovoltaic material.

FIG. 4 is a front view of the same aeroplane to show landing gear.

DETAILED DESCRIPTION OF A PREFERRED EMBODIMENT

Referring to FIG. 1 there is shown two sheets of solar photovoltaic material(1) joined together in such a way that conductive edge(2) makes contact with each other in order to collect electricity from both sheets. The material can be knitted in different patterns as long as the end of each fiber is joined into a contact strip which runs alongside the horizontal and vertical edge(2 and 3). The contact strip(2 and 3) can be placed by choice, anywhere, to or on the material when the right tools are available. The tools consist of a plain surface to which the material is to be put. Now, the contact strip is put on top of the material and pressed against it by a specially designed iron which is heated for this purpose. The heat will soften the plastic material(1) thereby making surface contact with the conductive fiber(4) and contact strip(2-3). When the hot iron is removed the melted plastic will harden and fuse the metal and fiber together. To obtain a more firmer grip from the contact strip(2-3) to the material, the contact strip could be made of a fine metal mesh as shown in FIG. 1(2-3).

FIG. 2 shows a detailed side view of a single threaded(4) which is made of carbon or magnesium fiber coated with a conductive plastic like lumeloid. The plastic(5) increases the strength of the fiber, at the same time collecting radiant solar energy, by converting incoming photons(6) into electrons which then travel alongside the fiber to a terminal(3) made of a fine electric conductive strip. From thereon the electricity is directed to the consumer.

FIG. 3 shows an aeroplane equipped with a spindle drive motor which is activated through electrical impulses. The electric supply line(8) is joined to a battery(7). The battery is charged through the electricity obtained from the skin and collected by a contact strip(2 and 3) which makes contact with each section of the material to direct electricity through a regulator(12) into battery(7). The drawing of FIG. 3 shows four sections of the material which have to match with contact edge(2). Vertical contact strip(3) does not have to match because its purpose is to collect electricity from the horizontal thread to guide it to the lower horizontal contact strip(2). It is recommended to use a ratchet gear(9) for propeller(10) in order to rotate propeller by wind current when engine(11) is not in use. This reduces resistance.

FIG. 4 shows a front view of the aeroplane showing the wing support(13) by using the fuselage(16) as support frame which is reinforced by landing gear(14) which joins the wings with the fuselage. The wheels(15) can be moved hydraulically inward to rest closely towards the wing support 13 or fuselage.

While there have been shown and described and pointed out the fundamental figures of the invention as applied to a preferred embodiment, it will be understood that varies ommissions and substitions and changes in the form and detail of the device illustrated and in its detail may be made by those skilled in the art without departing from spirit of the invention. It is the intention, therefore, to be limited only as indicated by the scope of the following claims.

I claim:

1. A flexible solar skin which comprises a knitted carbon or magnesium fiber coated with a photovoltaic material comprising a conductive polymer, said solar skin being adapted for lining the outer surfaces of zeppelins or airplanes.

2. A flexible solar skin as claimed in claim 1 which further includes a contact strip fused to said photovoltaic material by a heat treatment.

3. An airplane which includes the flexible solar skin of claim 1 covering at least a portion of the outer surface thereof and connected to a battery which in turn activates an impulse motor thereby to propel the airplane.

4. The airplane of claim 3 which further includes a hydraulic one stroke landing gear, whereby wheel axles are mounted to the plane in such a way that upon retraction, the wheels are inserted into the wing support or the fuselage.

* * * * *